(12) United States Patent
Smith (10) Patent No.: US 7,774,153 B1
(45) Date of Patent: Aug. 10, 2010

(54) COMPUTER-IMPLEMENTED METHODS, CARRIER MEDIA, AND SYSTEMS FOR STABILIZING OUTPUT ACQUIRED BY AN INSPECTION SYSTEM

(75) Inventor: James A. Smith, Los Altos, CA (US)

(73) Assignee: KLA-Tencor Corp., San Jose, CA (US)

( * ) Notice: Subject to any disclaimer, the term of this patent is extended or adjusted under 35 U.S.C. 154(b) by 185 days.

(21) Appl. No.: 12/049,858

(22) Filed: Mar. 17, 2008

(51) Int. Cl.
*G01D 18/00* (2006.01)

(52) U.S. Cl. ....................................................... 702/85

(58) Field of Classification Search ................ 702/85
See application file for complete search history.

(56) References Cited

U.S. PATENT DOCUMENTS

| | | | |
|---|---|---|---|
| 6,741,344 B1 * | 5/2004 | Stern et al. ................. | 356/317 |
| 6,961,626 B1 * | 11/2005 | Paik .............................. | 700/31 |
| 2003/0120447 A1 * | 6/2003 | Dzioba ......................... | 702/85 |
| 2006/0126914 A1 * | 6/2006 | Ishikawa ..................... | 382/149 |
| 2007/0033991 A1 * | 2/2007 | Rice et al. ..................... | 73/105 |
| 2008/0040064 A1 * | 2/2008 | Ishikawa ..................... | 702/108 |

\* cited by examiner

*Primary Examiner*—Bryan Bui
*Assistant Examiner*—Jonathan Teixeira Moffat
(74) *Attorney, Agent, or Firm*—Ann Marie Mewherter (57) ABSTRACT

Various computer-implemented methods, carrier media, and systems for stabilizing output acquired by an inspection system are provided. One computer-implemented method includes determining a characteristic of output acquired for a wafer by an inspection system using an inspection recipe. The method also includes comparing the characteristic to a reference characteristic. In addition, if the characteristic is above the reference characteristic, the method includes altering the output acquired for the wafer such that the characteristic of the altered output substantially matches the reference characteristic thereby stabilizing the output acquired for the wafer to the reference characteristic.

17 Claims, 4 Drawing Sheets

COMPUTER-IMPLEMENTED METHODS, CARRIER MEDIA, AND SYSTEMS FOR STABILIZING OUTPUT ACQUIRED BY AN INSPECTION SYSTEM

BACKGROUND OF THE INVENTION

1. Field of the Invention

The present invention generally relates to computer-implemented methods, carrier media, and systems for stabilizing output acquired by an inspection system. Certain embodiments relate to a computer-implemented method for stabilizing output acquired by an inspection system by stabilizing output acquired for a wafer by the inspection system to a reference characteristic.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

In order for inspection to provide useful results for yield control, the inspection process must be able to discriminate between real defects on the wafer and noise or nuisance events. Noise may be generally defined as events detected on a wafer by an inspection tool that are not actually defects but appear as potential defects due to marginalities in the inspection tool such as marginalities in data processing and/or data acquisition. Nuisance events are actual defects but are not relevant to controlling the process or predicting yield. In some instances, the noise and nuisance events detected by an inspection tool can be reduced by using optimized data acquisition parameters and optimized data processing parameters. In addition, the noise and nuisance events can be reduced by applying various filtering techniques to the inspection results.

As design rules shrink, however, semiconductor manufacturing processes may be operating closer to the limitations on the performance capability of the processes. In addition, smaller defects can have an impact on the electrical characteristics of the device as the design rules shrink, which drives more sensitive inspections. Therefore, as design rules shrink, the signals corresponding to defects detected by inspection systems may be lower, while the noise detected by the inspection systems may be much higher due to the limitations in the processes. As such, discriminating between defects and noise is becoming much more difficult. Unless such issues are addressed adequately, the accuracy of defect detection and therefore the ability to monitor and control semiconductor fabrication processes may be dramatically reduced.

Furthermore, variations in the process itself may cause variations on wafers (from wafer-to-wafer and within wafer) that may appear as noise and/or nuisance events in the output acquired for the wafers by an inspection system. For example, an inspection recipe used for a particular layer of a wafer is typically setup using one wafer, and then the inspection recipe is re-used for the same layer on other wafers. However, if the additional wafers vary from the wafer used to setup the recipe due to process variations, the variations may appear as noise and/or nuisance events in the output acquired for those wafers by the inspection system. Such noise and/or nuisance events can be so overwhelming as to make real defects and/or defects of interest (DOI) impossible to detect using the output acquired by the inspection system. Therefore, such process variations can cause an inspection recipe to be unstable over time, possibly to the extent that the recipe must be changed or even a new recipe created such that wafers subject to the process variations can be inspected. In addition, typically such variations are not interesting to the user of the inspection system. As such, output of an inspection system responsive to such process variations can not only make defect detection difficult if not impossible but there is also no advantage to detecting such process variations.

Accordingly, it would be advantageous to develop computer-implemented methods, carrier media, and systems for stabilizing output acquired by an inspection system using an inspection recipe.

SUMMARY OF THE INVENTION

The following description of various embodiments of computer-implemented methods, carrier media, and systems is not to be construed in any way as limiting the subject matter of the appended claims.

One embodiment relates to a computer-implemented method for stabilizing output acquired by an inspection system. The method includes determining a characteristic of output acquired for a wafer by an inspection system using an inspection recipe. The method also includes comparing the characteristic to a reference characteristic. In addition, if the characteristic is above the reference characteristic, the method includes altering the output acquired for the wafer such that the characteristic of the altered output substantially matches the reference characteristic thereby stabilizing the output acquired for the wafer to the reference characteristic.

In one embodiment, the output acquired for the wafer includes raw intensity data acquired by the inspection system, and the characteristic is a characteristic of the raw intensity data. In another embodiment, the output includes intensity data. In one such embodiment, the characteristic is a characteristic of the intensity data acquired across a portion of the wafer. In another such embodiment, the characteristic is a bandwidth of a histogram of the intensity data acquired across a portion of the wafer. In some embodiments, determining the characteristic includes determining the characteristic for each job in a scan of the wafer using the output corresponding to each job.

In one embodiment, the reference characteristic is selected by a user. In another embodiment, the reference characteristic is a characteristic of output acquired for a different wafer by an inspection system, and the different wafer is used to setup the inspection recipe. In one such embodiment, comparing the characteristic to the reference characteristic includes comparing the characteristic determined for a job in a scan of the wafer to the reference characteristic determined for a corresponding job in a scan of the different wafer. In some such embodiments, comparing the characteristic to the reference characteristic also includes comparing the characteristic to a different reference characteristic selected by a user, and if the characteristic is above the reference characteristic or the different reference characteristic, altering the output includes altering the output acquired for the wafer such that the characteristic of the altered output substantially matches the reference characteristic or the different reference characteristic, respectively.

In one embodiment, determining the characteristic includes determining the characteristic for a job in a scan of the wafer using the output corresponding to the job. In one such embodiment, the reference characteristic is selected from the lowest of a reference characteristic determined for a corresponding job in a scan of a different wafer performed by an inspection system, where the different wafer is used to setup the inspection recipe, or a different reference characteristic selected by a user. In another embodiment, altering the output further stabilizes the output acquired for the wafer by reducing variations in noise in the output as a function of position across the wafer.

In one embodiment, the output includes intensity data, and altering the output includes linear mapping the intensity data corresponding to a job in a scan of the wafer to the reference characteristic. In another embodiment, the determining step, the comparing step, and the altering step are performed on a job-to-job basis as the output is acquired for the wafer. In an additional embodiment, the determining step, the comparing step, and the altering step are performed prior to using the output to detect defects on the wafer. In one such embodiment, if the altering step is not performed, the method includes using the output to detect the defects on the wafer, and if the altering step is performed, the method includes using the altered output to detect the defects on the wafer.

In one embodiment, the reference characteristic is a characteristic of output acquired for a different wafer by an inspection system, and the different wafer is used to setup the inspection recipe. In one such embodiment, the inspection system that acquired the output for the wafer is the inspection system that acquired the output for the different wafer. In another such embodiment, the inspection system that acquired the output for the wafer is a different inspection system than the inspection system that acquired the output for the different wafer, and the altering step further stabilizes the output acquired for the wafer by the inspection system to the different inspection system.

In one embodiment, stabilizing the output acquired for the wafer to the reference characteristic includes reducing noise in the output acquired for the wafer due to process variations on the wafer. In another embodiment, the output for the wafer includes output acquired in a dark field mode of the inspection system.

Each of the steps of the method described above may be further performed as described herein. In addition, each of the embodiments of the method described above may include any other step(s) of any other method(s) described herein. Furthermore, each of the embodiments of the method described above may be performed by any of the systems described herein.

Another embodiment relates to a carrier medium that includes program instructions executable on a computer system for stabilizing output acquired by an inspection system. The computer-implemented method includes determining a characteristic of output acquired for a wafer by an inspection system using an inspection recipe. The method also includes comparing the characteristic to a reference characteristic. In addition, if the characteristic is above the reference characteristic, the method includes altering the output acquired for the wafer such that the characteristic of the altered output substantially matches the reference characteristic thereby stabilizing the output acquired for the wafer to the reference characteristic.

The carrier medium described above may be further configured as described herein. The steps of the computer-implemented method for which the program instructions are executable may be performed as described further herein. In addition, the computer-implemented method for which the program instructions are executable may include any other step(s) of any other method(s) described herein.

An additional embodiment relates to a system configured to stabilize output acquired by an inspection system. The system includes an inspection system configured to acquire output for a wafer using an inspection recipe. The system also includes a computer system configured to determine a characteristic of the output for the wafer. The computer system is also configured to compare the characteristic to a reference characteristic. In addition, if the characteristic is above the reference characteristic, the computer system is configured to alter the output acquired for the wafer such that the characteristic of the altered output substantially matches the reference characteristic thereby stabilizing the output acquired for the wafer to the reference characteristic. The system may be further configured according to any embodiment(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

In general, the embodiments described herein can be used for stabilizing output acquired by an inspection system. For example, one embodiment relates to a computer-implemented method for stabilizing output acquired by an inspection system. The inspection system may include any suitable inspection system known in the art. For example, the inspection system may include a commercially available inspection system such as the Puma 90xx and 91xx series tools, which are commercially available from KLA-Tencor, San Jose, Calif. In addition, the inspection system may be an inspection system configured for dark field (DF) inspection of a wafer and/or bright field (BF) inspection of a wafer. Furthermore, the inspection system may be configured for patterned wafer and/or unpatterned wafer inspection. Moreover, an existing inspection system may be modified (e.g., a computer system of the inspection system may be modified) such that the existing inspection system can perform one or more embodiments of the computer-implemented methods described herein.

The method includes determining a characteristic of output acquired for a wafer by an inspection system using an inspection recipe. The output acquired by the inspection system, for which a characteristic is determined and which is stabilized by embodiments described herein, may include any output of the inspection system, which may vary depending on the configuration of the inspection system and the wafer being inspected. For example, in one embodiment, the output acquired for the wafer includes output acquired in a DF mode of the inspection system. However, the output acquired for the wafer that is stabilized by the embodiments described herein may include output acquired for the wafer in a DF mode, a BF mode, any other mode of the inspection system, or some combination thereof.

The output may be acquired for the wafer by the inspection system using any inspection recipe. The inspection recipe is preferably created for inspection of the layer of the wafer that is currently being inspected. The inspection recipe may be created in any suitable manner. In addition, the embodiments described herein may include acquiring the output for the wafer. For example, acquiring the output for the wafer may include acquiring (e.g., retrieving) the output for the wafer stored by the inspection system in one or more storage media, which may be coupled to or included in the inspection system, and which may include any suitable storage medium or media including the storage media described further herein. In another example, acquiring the output for the wafer may include acquiring (e.g., receiving) the output for the wafer as the output is generated by the inspection system. In addition, acquiring the output may include scanning the wafer using the inspection system and recipe or otherwise using the inspection system and recipe to detect light scattered or reflected from the wafer.

Determining the characteristic of the output acquired for the wafer may be performed using the output and any suitable method, algorithm, or some combination thereof, which may vary depending on the characteristic being determined and the output used to determine the characteristic. The output for which a characteristic is determined by the embodiments described herein may be raw data or signals generated by the inspection system. In some embodiments, the output may be responsive to the intensity of light scattered from the wafer and detected by a detector of the inspection system. In one embodiment, the output acquired for the wafer includes raw intensity data acquired by the inspection system, and the characteristic is a characteristic of the raw intensity to data. The characteristic of the raw intensity data may be any of the characteristics described herein determined according to any of the embodiments described herein.

In one embodiment, the output includes intensity data, and the characteristic is a characteristic of the intensity data acquired across a portion of the wafer. In this mariner, the characteristic may be separately determined for different portions of the wafer. The different portions of the wafer may correspond to different portions of the wafer as defined in the inspection recipe. For example, each different portion of the wafer may correspond to a different job in a scan of the wafer. In one such embodiment, determining the characteristic includes determining the characteristic for each job in a scan of the wafer using the output corresponding to each job. In particular, output acquired by an inspection system during a scan of a wafer may be separated into jobs that are processed separately. A "job" may be generally defined as a two-dimensional array of pixels in the output, which corresponds to an area on the wafer that is scanned by the inspection system. For example, a job may include an array of about 5 pixels by about 5 pixels to about 12 pixels by about 12 pixels (the pixels along the two axes of the array may or may not be equal). As such, a job includes more than one pixel, but is generally much smaller than a frame. In this manner, the characteristic may be determined for different areas on the wafer. In some such embodiments, during a wafer scan, (for each job) the image intensity data may be collected and the characteristic (for each job) may be computed and stored.

In one embodiment in which the output includes intensity data, the characteristic is a bandwidth of a histogram of the intensity data acquired across a portion of the wafer. For example, the characteristic may be the bandwidth of a histogram of the intensity data acquired for a job. In one such example, during a wafer scan, (for each job) the histograms of the image intensity data are collected, and the bandwidths of the histograms are computed and stored. A histogram of intensity data is a plot illustrating the numbers of pixels having different values of the intensity data. The bandwidth of a histogram can be generally defined as the difference between the high point and the low point on the histogram. In this manner, in a histogram of intensity data, the bandwidth explains or tracks with noise and/or nuisance. For example, jobs that have relatively low bandwidth values have relatively low noise and/or nuisance in the output corresponding to the jobs, while jobs that have relatively high bandwidth values have relatively high noise and/or nuisance in the output corresponding to the jobs. In this manner, the bandwidth is a particularly advantageous characteristic for use in embodiments described herein because the bandwidth corresponds to noise and/or nuisance in the intensity data. However, any other characteristic of the intensity data or other output acquired for the wafer that corresponds to noise and/or nuisance in a similar manner may be determined and used as described further herein.

The computer-implemented method also includes comparing the characteristic to a reference characteristic. Such comparing may be performed using any suitable method, algorithm, or combination thereof. The characteristic and the reference characteristic are preferably the same type of characteristic for the output. For example, the characteristic of the output may be the bandwidth of a histogram of intensity data acquired for the wafer, and the reference characteristic may be a predetermined value for the bandwidth. In one embodiment, the reference characteristic is selected by a user. The user may select the reference characteristic in any suitable manner. In another embodiment, the reference characteristic is a characteristic of output acquired for a different wafer by an inspection system, and the different wafer is used to setup the inspection recipe. The characteristic of the output acquired for the different wafer may include any of the characteristics described herein and may be determined according to any of the embodiments described herein. The output acquired for the different wafer may be output that is acquired during setup of the inspection recipe or output for the different wafer that is acquired using the setup inspection recipe. The embodiments described herein may or may not include determining the reference characteristic. For example, in one embodiment, the computer-implemented method includes collecting baseline histogram data for the different wafer that is used as the reference characteristic.

In one embodiment in which the reference characteristic is a characteristic of output acquired for a different wafer by an inspection system and the different wafer is used to setup the inspection recipe, comparing the characteristic to the reference characteristic includes comparing the characteristic determined for a job in a scan of the wafer to the reference characteristic determined for a corresponding job in a scan of the different wafer. In this manner, the characteristic may be compared to the reference characteristic on a job-to-job basis. For example, the reference characteristic may be determined and stored as a function of job in a scan of the different wafer. The reference characteristic may be determined as a function of job in a scan of the different wafer as described further herein. In this manner, the reference characteristic may be determined for different areas on the different wafer.

Figure 1:
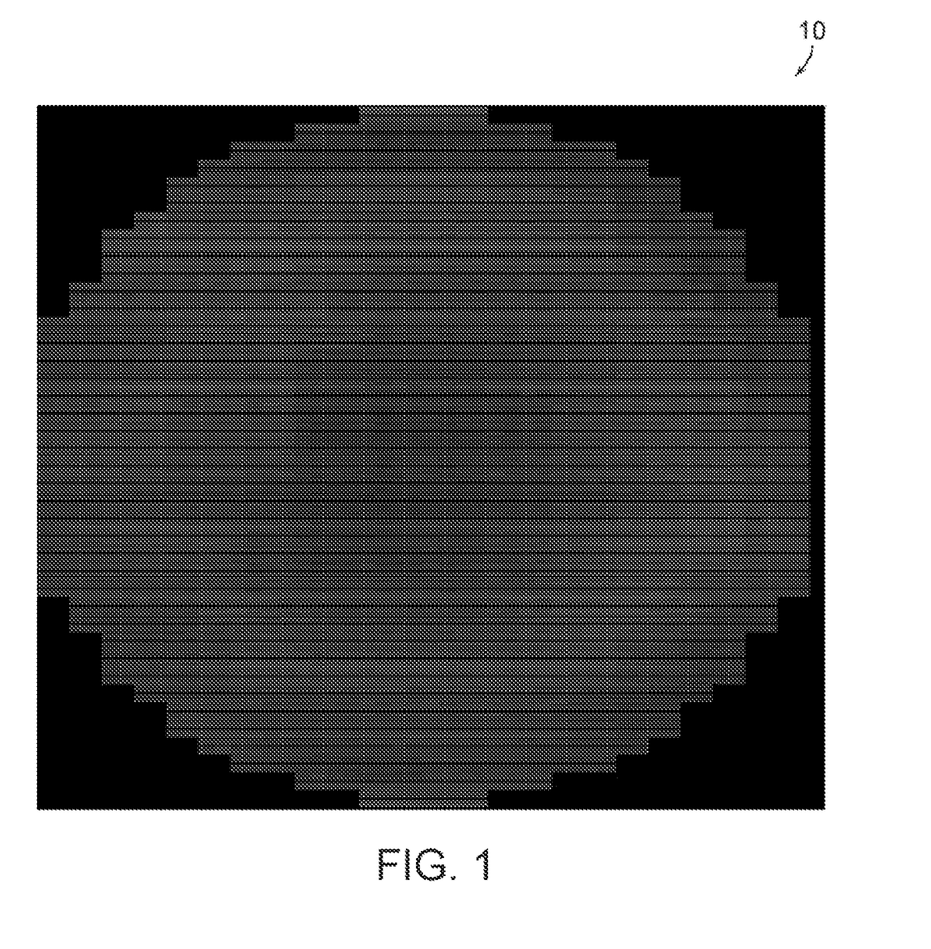
FIGS. 1-4 are experimental results acquired using one or more steps of one or more computer-implemented method embodiments described herein for stabilizing output acquired by an inspection system.

Such a reference characteristic may be stored in any suitable data structure that can be used to store the reference characteristic as a function of job or area on the different wafer. For example, as shown in FIG. 1, if the reference characteristic is the bandwidth of a histogram, map 10 of histogram bandwidths may be generated and stored. This map may then be used for the comparison step described above. For example, for a job in a scan of the wafer being inspected, the bandwidth of a histogram in the map corresponding to that particular job may be accessed in the map (read back) and used for comparison. In another example, bandwidths of histograms determined for a wafer being inspected may be used to generate another map of the bandwidths as a function of job, and that map may then be compared to the map of the reference bandwidths.

In contrast to the comparison that may be performed when the reference characteristic is a characteristic of output acquired for a different wafer, if the reference characteristic is selected by a user, the same value of the reference characteristic (the value selected by the user) may be compared to all characteristics determined for the output acquired for the wafer.

Regardless of which reference characteristic is used for the comparison step of the computer-implemented method, the reference characteristic may be determined prior to scanning of the wafer or inspection of the wafer. For example, the reference characteristic may be determined after the inspection recipe is setup, and the reference characteristic may be stored in the inspection recipe or stored in a storage medium with information about the location of the reference characteristic stored in the inspection recipe such that the stored reference characteristic may be accessed during inspection performed using the inspection recipe. In this manner, the reference characteristic may be "fixed" or the same for all wafers inspected using a particular inspection recipe.

If the characteristic is above the reference characteristic, the method includes altering the output acquired for the wafer such that the characteristic of the altered output substantially matches the reference characteristic thereby stabilizing the output acquired for the wafer to the reference characteristic. For example, as described above, the characteristic may be the bandwidth of a histogram of intensity data or another characteristic that corresponds to or tracks with noise and/or nuisance in the output. In addition, the reference characteristic may be a characteristic determined for a different wafer that is used to setup the inspection recipe and will therefore correspond to output acquired for a relatively quiet wafer in terms of noise and nuisance (e.g., since the inspection recipe was setup using that wafer, the inspection recipe parameters will be optimized for that wafer thereby leading to relatively quiet output acquired for the different wafer using the inspection recipe). Furthermore, the reference characteristic selected by the user may correspond to relatively quiet output. Therefore, a characteristic that is above the reference characteristic indicates that the output acquired for the wafer is relatively noisy compared to the reference characteristic and therefore that the output acquired for the wafer should be altered. For example, a relatively low bandwidth value for a job indicates that nothing needs to be done to the output corresponding to the job prior to defect detection because that output is relatively quiet. However, a relatively high bandwidth value for a job indicates that the output corresponding to the job should be altered prior to defect detection because that output is relatively noisy.

In this manner, altering the output may include histogram matching (to a prior scan of the different wafer). For example, collected data (e.g., the reference characteristic determined for output acquired for a different wafer) may be used to modify future scan data so that it matches the noise distribution of the prior scan data.

Since the reference characteristic corresponds to relatively quiet output, matching (or substantially matching) the characteristic to the reference characteristic by altering the output effectively reduces noise and nuisance in the output acquired for the wafer. Reducing the noise in the output will increase the signal-to-noise ratio (S/N) of the output corresponding to defects. In this manner, the computer-implemented methods described herein can be used to increase sensitivity of inspection systems (e.g., by increasing the S/N of the output acquired for wafers by the inspection systems thereby increasing the sensitivity with which the output can be used to detect defects on the wafers). In addition, it is believed that this is the first time that wafer-to-wafer information (e.g., prior history) has been used and demonstrated to improve inspection results. Therefore, the embodiments described herein open up a whole new approach to combat noise in inspection output.

In some embodiments, stabilizing the output acquired for the wafer to the reference characteristic includes reducing noise in the output acquired for the wafer due to process variations on the wafer. For example, process variations can lead to variations in scattering intensity differences across wafers and/or across a single wafer, which can create noise and/or nuisance in output acquired for the wafers but is not interesting to the user since the scattering intensity differences are not indicative of actual defects or defects of interest (DOI). However, altering the output such that the characteristic of the altered output substantially matches the reference characteristic effectively stabilizes the output to noise and/or nuisance from wafer-to-wafer and across wafer. Such noise and/or nuisance may include wafer-to-wafer and across wafer process variations (e.g., grain noise, color noise, etc.) to which inspection recipes and particularly hot recipes are unstable. Therefore, the computer-implemented method effectively stabilizes the output generated using the inspection recipe from wafer-to-wafer and across wafer.

In this manner, the computer-implemented method embodiments described herein can be used to stabilize inspection tool performance and prevent "blow-ups." For example, if an inspection recipe is stable under ordinary conditions but blows-up due to occasional process variations, the embodiments described herein can prevent the blow-ups across wafers while maintaining sensitivity of inspection. Therefore, the embodiments provide greater sensitivity to key DOI (e.g., any DOI) in the presence of extreme process variation, both relatively high wafer-to-wafer variation and relatively high within wafer variation. In this manner, the embodiments described herein can be used to make inspection recipes production worthy without sacrificing sensitivity. Moreover, because the embodiments described herein are capable of dramatically reducing noise and/or nuisance in output acquired by an inspection system for a wafer, the embodiments described herein allow hotter recipes to be written and used for inspection and even inspection for production applications.

As described above, the characteristic is compared to a reference characteristic. However, the characteristic may be compared to more than one reference characteristic (e.g., different reference values of the same characteristic). For example, in one embodiment described further herein, the reference characteristic is a characteristic of output acquired for a different wafer by an inspection system, and the different wafer is used to setup the inspection recipe. In one such embodiment, the comparing step includes comparing the characteristic determined for a job in a scan of the wafer to the reference characteristic determined for a corresponding job in a scan of the different wafer and comparing the characteristic to a different reference characteristic selected by a user. Such comparing may be performed as described further herein. In this manner, the characteristic determined for each job may be compared to both of the characteristics, one which varies from job-to-job across the wafer (the reference characteristic corresponding to the different wafer) and one which is constant across the wafer (the reference characteristic selected by the user). In some such embodiments, if the characteristic is above the reference characteristic or the different reference characteristic, altering the output includes altering the output acquired for the wafer such that the characteristic of the altered output substantially matches the reference characteristic or the different reference characteristic, respectively. In this manner, the output may be altered to match one of the reference characteristics, namely the reference characteristic that is less than the characteristic of the output. Such altering may be performed as described further herein.

As described above, more than one reference characteristic may be compared to the characteristic of the output. However, more than one reference characteristic may be effectively compared to the characteristic of the output without actually comparing each reference characteristic to the characteristic. For example, in one embodiment, determining the characteristic includes determining the characteristic for a job in a scan of the wafer using the output corresponding to the job, which may be performed as described further herein, and the reference characteristic is selected from the lowest of a reference characteristic determined for a corresponding job in a scan of a different wafer performed by an inspection system, where the different wafer is used to setup the inspection recipe, or a different reference characteristic selected by a user. In this manner, the reference characteristic for each job may be compared to the reference characteristic selected by a user, and the reference characteristic that is lowest may be compared to the characteristic of the corresponding job. Such comparing may be performed as described further herein.

Comparing the characteristic to more than one reference characteristic, one of which varies from job-to-job across the wafer and one of which is constant across the wafer, may be advantageous for a number of reasons. For example, if the output corresponding to different areas of the wafer has different noise and/or nuisance characteristics due to process variations across the wafer, simply comparing the characteristic to the reference characteristic determined from the output for the different wafer may not sufficiently reduce the noise and/or nuisance in the output due to the across wafer process variations. In one such example, if the wafer and the different wafer both are relatively noisy in corresponding areas of the wafer (e.g., have the same or similar noise signatures), the reference characteristics for those areas may correlate to a relatively high level of noise. Therefore, using such a reference characteristic, the noise and/or nuisance in the output acquired for the wafer corresponding to those areas may not be reduced as much as in other areas of the wafer and may not be reduced sufficiently to detect as many real defects or DOI as possible.

However, using a reference characteristic selected by a user or another reference characteristic that is constant across the wafer for such comparison and matching of the output will effectively reduce the noise and/or nuisance in areas of the wafer corresponding to relatively noisy areas of the different wafer used for inspection recipe setup while using the reference characteristic determined from the output acquired for the different wafer for comparison and matching in other areas of the wafer will effectively reduce the noise and/or nuisance in those areas. In this manner, in some embodiments, the altering step further stabilizes the output acquired for the wafer by reducing variations in the output as a function of position across the wafer. In addition, regardless of the reference characteristic(s) used for the comparing and altering steps, the altering step stabilizes the output acquired for the wafer by reducing variations in noise and/or nuisance from wafer-to-wafer. For example, remapping the image data to the reference bandwidths or to a value set by a user (whichever is lowest) stabilizes the recipe against wafer-to-wafer blowups due to process variations that are not interesting to the user. Furthermore, within wafer blowups are reduced so that inspection recipe parameters can be set for maximum sensitivity in "quiet regions" but blow-ups are prevented by this bandwidth matching technique.

Altering the output acquired for the wafer such that the characteristic of the altered output substantially matches the reference characteristic may be performed in a number of suitable manners. For example, the bandwidths stored in a map of histogram bandwidths such as that shown in FIG. 1 may be read back and used to remap corresponding future jobs for scans performed using the same inspection recipe. Using the bandwidths in this manner matches future scans to the baseline scan data. In another embodiment, the output includes intensity data, and altering the output includes linear mapping the intensity data corresponding to a job in a scan of the wafer to the reference characteristic. Linear mapping the intensity data may be performed using any suitable method, algorithm, or some combination thereof.

Figure 2:
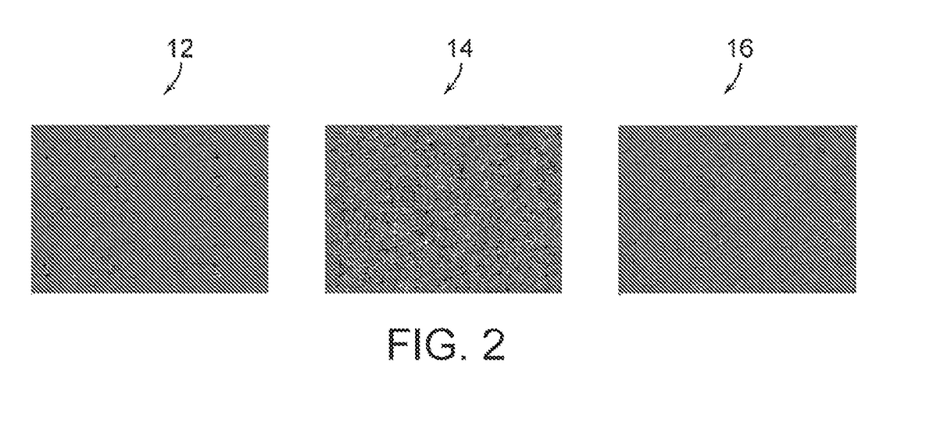

FIG. 2 illustrates one example of a difference image that was obtained by mapping scan data for a job to baseline scan data for a prior job. In particular, difference image 12 is a difference image for a relatively quiet prior job. In other words, as shown in difference image 12, the output for this prior job has relatively low noise. Difference image 14 is a difference image for a relatively noisy corresponding job on another wafer. In other words, the output for this job has relatively high noise. Output for this job was altered (remapped) such that the bandwidth of the histogram of the intensity data for this job substantially matched the bandwidth of the histogram of the intensity data for the relatively quiet prior job. As shown by difference image 16 of the remapped job, the resulting difference image has substantially less noise than difference image 14 for the relatively noisy job. In this manner, altering the output as described herein substantially reduces noise in the output thereby increasing the sensitivity with which defects can be detected using the output.

Figure 3:
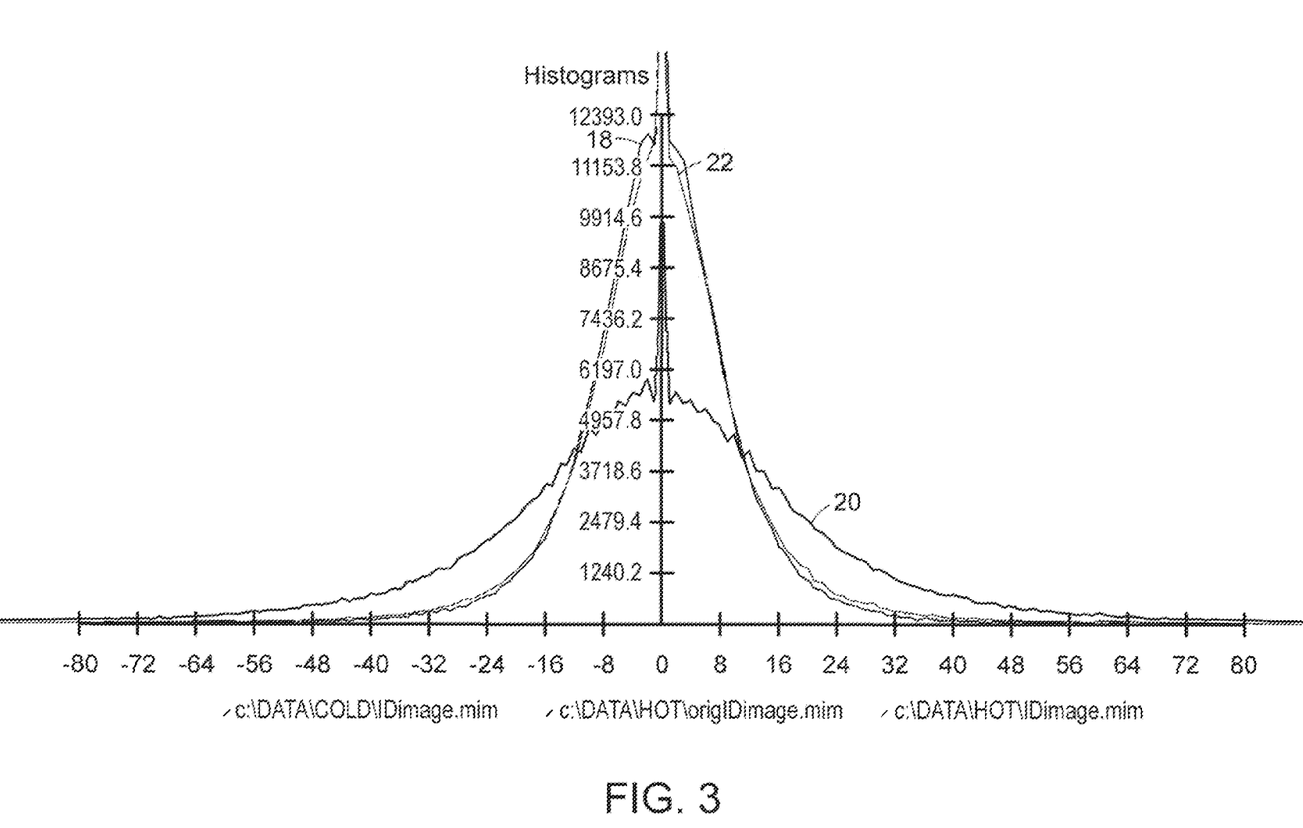

FIG. 3 shows histograms corresponding to the difference images shown in FIG. 2. In particular, histogram 18 is the histogram of the intensity data for the relatively quiet prior job. Histogram 20 is the histogram of the intensity data for the relatively noisy job. As shown in FIG. 3, histograms 18 and 20 have dramatically different bandwidths. However, after alteration (remapping) of the intensity data for the relatively noisy job to the bandwidth of histogram 18 of the intensity data for the relatively quiet job, histogram 22 of the remapped intensity data has a bandwidth that substantially matches the bandwidth of histogram 18. Therefore, remapping intensity data as described above such that the bandwidth of a histogram of the intensity data substantially matches a reference bandwidth clearly reduces noise in the difference image corresponding to the noisy job. Remapping the intensity data for the relatively noisy job to the bandwidth of the histogram of the intensity data for the relatively quiet job was performed using the following functions:

$$\alpha_{Measured} = \frac{1}{BW_{Measured}}$$

$$\alpha_{Desired} = \frac{1}{BW_{Desired}}$$

$$I_{Remapped} = \frac{\alpha_{Desired}}{\alpha_{Measured}}(I - I_0^{Measured}) + I_0^{Desired}$$

where BW is the bandwidth of the histogram of intensity data, $\alpha$ is a defined parameter equivalent to a gain, $I_0$ is the intensity point that is being matched, "Measured" indicates variables corresponding to the current wafer, "Desired" indicates variables corresponding to the previous wafer, and "Remapped" indicates the intensity corresponding to the altered output that may be determined using the above equations.

Figure 4:
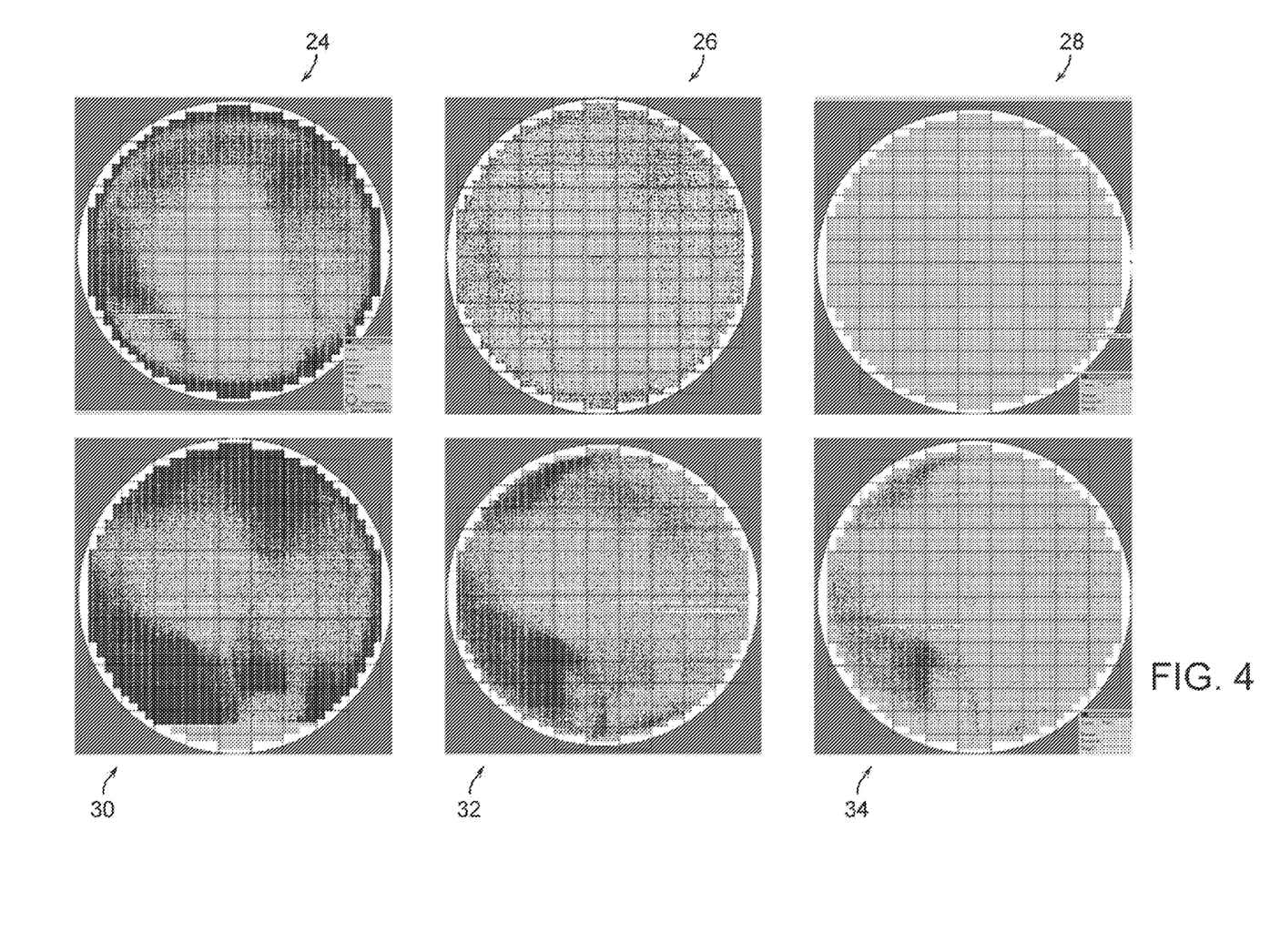

FIG. 4 illustrates wafer maps showing defect counts that were obtained using the methods described herein for two different wafers at the metal 2 etch layer. In particular, output acquired for a relatively noisy wafer was used as input to a die-to-die defect detection algorithm to detect defects on the wafer, and wafer map 24 shows the defect count for this relatively noisy wafer. The defect count for the relatively noisy wafer was greater than 300,000.

The output for the relatively noisy wafer was altered such that the bandwidth of the histogram of the intensity data of the altered output substantially matched a first setting for the bandwidth parameter (a maximum bandwidth of 150). Defects were detected using the altered output as input to the die-to-die defect detection algorithm, and wafer map 26 was generated showing the number of defects detected using the altered output. The defect count shown in this wafer map is 4629, which is dramatically less than 300,000.

The output for the relatively noisy wafer was also altered such that the bandwidth of the histogram of the intensity data of the altered output substantially matched a second setting for the bandwidth parameter (a maximum bandwidth of 100). The second setting was more aggressive than the first setting. Defects were detected using the altered output as input to the die-to-die defect detection algorithm, and wafer map 28 was generated showing the number of defects detected using the altered output. The defect count shown in this wafer map is 276, which is dramatically less than both 4629 and 300,000.

Therefore, as shown by wafer maps 24, 26, and 28, at various settings of the bandwidth parameter, the nuisance signature was completely removed on the noisy wafer, and the capture of key DOI was greatly increased. In addition, the process nuisance was reduced without changing the data acquisition settings of the inspection recipe.

Although the method is particularly advantageous for relatively noisy wafers, the methods described herein can also increase the capture of key DOI for relatively quiet wafers. For example, output acquired for a relatively quiet wafer was used as input to the die-to-die defect detection algorithm to detect defects on the wafer. The output was acquired for the relatively quiet wafer using the same inspection recipe settings as those used for scanning the relatively noisy wafer described above. Wafer map 30 shows the defect count for this relatively quiet wafer. The defect count for the relatively quiet wafer was greater than 500,000.

However, the output for the relatively quiet wafer was altered such that the bandwidth of the histogram of the intensity data of the altered output substantially matched the first setting for the bandwidth parameter described above. Defects were detected using the altered output as input to the die-to-die defect detection algorithm, and wafer map 32 was generated showing the number of defects detected using the altered output. The defect count shown in this wafer map is 54,412, which is dramatically less than 500,000.

The output for the relatively quiet wafer was also altered such that the bandwidth of the histogram of the intensity data of the altered output substantially matched the second setting for the bandwidth parameter described above. Defects were detected using the altered output as input to the die-to-die defect detection algorithm, and wafer map 34 was generated showing the number of defects detected using the altered output. The defect count shown in this wafer map is 8,522, which is dramatically less than both 54,412 and 500,000.

Therefore, as shown by wafer maps 30, 32, and 34, at various settings of the bandwidth parameter, the capture of key DOI was greatly increased. In addition, the process nuisance was reduced without changing the data acquisition settings of the inspection recipe.

In one embodiment, the computer-implemented method is performed in real time (e.g., as the output is acquired for the wafer). For example, in one embodiment, determining the characteristic, comparing the characteristic, and altering the output are performed on a job-to-job basis as the output is acquired for the wafer. These steps may be performed for other portions of the wafer (portions other than jobs) in a similar manner. Furthermore, determining the characteristic, comparing the characteristic, and altering the output may be performed for every job in a scan of the wafer, and these steps may be performed separately for each job.

The computer-implemented method may also be performed as a pre-processing stage of the inspection (e.g., before defect detection) using raw output (e.g., raw intensity data) acquired by the inspection system. For example, in one embodiment, determining the characteristic, comparing the characteristic, and altering the output are performed prior to using the output to detect defects on the wafer. Other pre-processing functions may also be performed on the output prior to detecting the defects on the wafer. Such pre-processing functions may be performed on the acquired output if the output is not altered or the altered output if the output is altered.

In one such embodiment, if the altering step is not performed, the method includes using the output to detect the defects on the wafer, and if the altering step is performed, the method includes using the altered output to detect the defects on the wafer. Furthermore, as described above, determining the characteristic, comparing the characteristic, and altering the output may be performed for every job in a scan of the wafer, and after these steps are performed for each job, defects may then be detected in each job. Detecting the defects may be performed using any suitable defect detection method, algorithm, or some combination thereof. In addition, the defects detected on the wafer may include any defects. As described above, altering the output based on the results of the comparing step substantially reduces noise and/or nuisance in the output acquired for the wafer and stabilizes the output acquired for the wafer. Therefore, detecting defects using the output produced by the computer-implemented method will result in defect detection results (e.g., a defect population), a substantial portion of which includes real defects or DOI and relatively few nuisance events.

As described above, the reference characteristic may be a characteristic of output acquired for a different wafer. In particular, as described above, in one embodiment, the reference characteristic is a characteristic of output acquired for a different wafer by an inspection system, and the different wafer is used to setup the inspection recipe. In one such embodiment, the inspection system that acquired the output for the wafer is the inspection system that acquired the output for the different wafer. In this manner, the output for the wafer and the different wafer may be acquired by the same inspection system. A reference characteristic determined using such output acquired for the different wafer can be used as described herein to stabilize the output acquired for the wafer to the reference characteristic thereby stabilizing the inspection recipe across wafers as described further above.

However, such a reference characteristic may also be used to stabilize the output acquired for wafers across inspection systems. For example, in another such embodiment, the inspection system that acquired the output for the wafer is a different inspection system than the inspection system that acquired the output for the different wafer, and the altering step further stabilizes the output acquired for the wafer by the inspection system to the different inspection system. In this manner, the output for the wafer and the different wafer may be acquired by different inspection systems (although the different inspection systems may be of the same make and model (e.g., two different Puma 9000 tools)). In addition, since the reference characteristic is specific to the inspection recipe, if the same inspection recipe is run on the different inspection systems, the same reference characteristic can be used to stabilize the output acquired by the different inspection systems thereby stabilizing the different inspection systems to each other. Such stabilizing, therefore, effectively matches inspection systems (e.g., tool-to-tool matching) and can improve tool-to-tool matching. Therefore, the embodiments described herein are applicable and effective in matching performance/sensitivity from tool-to-tool. Such tool-to-tool matching is advantageous particularly when multiple inspection systems of the same make and model are used in a single fab to monitor a particular layer on a wafer. In particular, such tool-to-tool matching allows results of inspection to be compared to each other regardless of which inspection tool was used to produce the inspection results. A reference characteristic selected by a user can also be used to stabilize the output acquired by different inspection systems using the same inspection recipe thereby stabilizing the different inspection systems to each other.

All of the methods described herein may include storing results of one or more steps of the method embodiments in a storage medium. The results may include any of the results described herein and may be stored in any manner known in the art. The storage medium may include any suitable storage medium known in the art. After the results have been stored, the results can be accessed in the storage medium and used by any of the method or system embodiments described herein, displayed to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Each of the embodiments of the method described above may include any other step(s) of any other method(s) described herein. In addition, each of the embodiments of the method described above may be performed by any of the systems described herein.

Figure 5:
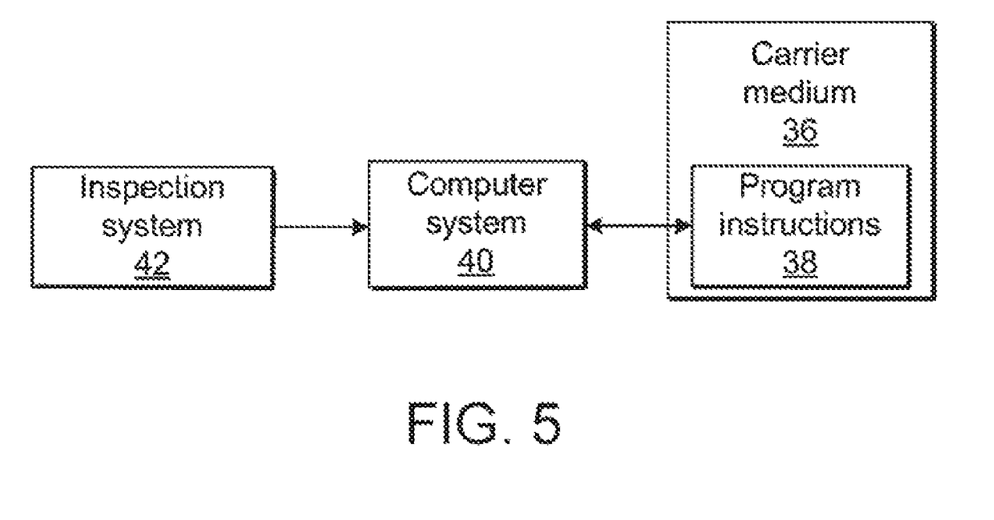
FIG. 5 is a block diagram of one embodiment of a carrier medium that includes program instructions executable on a computer system for performing one or more embodiments of a computer-implemented method described herein and one embodiment of a system configured to stabilize output acquired by an inspection system.

Another embodiment relates to a carrier medium that includes program instructions executable on a computer system for performing a computer-implemented method for stabilizing output acquired by an inspection system. One embodiment of such a carrier medium is shown in FIG. 5. In particular, carrier medium 36 includes program instructions 38 executable on computer system 40 for performing a computer-implemented method.

The computer-implemented method includes determining a characteristic of output acquired for a wafer by an inspection system using an inspection recipe. Determining the characteristic may be performed according to any of the embodiments described herein. The computer-implemented method also includes comparing the characteristic to a reference characteristic. Comparing the characteristic may be performed according to any of the embodiments described herein. In addition, if the characteristic is above the reference characteristic, the computer-implemented method includes altering the output acquired for the wafer such that the characteristic of the altered output substantially matches the reference characteristic thereby stabilizing the output acquired for the wafer to the reference characteristic. Altering the output may be performed according to any of the embodiments described herein.

The computer-implemented method executable on the computer system by the program instructions may include any other step(s) of any other method(s) described herein. In addition, the carrier medium may be further configured as described herein.

Program instructions 38 implementing methods such as those described herein may be transmitted over or stored on carrier medium 36. The carrier medium may be a transmission medium such as a wire, cable, or wireless transmission link. The carrier medium may also be a storage medium such as a read-only memory, a random access memory, a magnetic or optical disk, or a magnetic tape. In addition, the carrier medium may be any suitable computer-readable medium known in the art.

Computer system 40 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

An additional embodiment relates to a system configured to stabilize output acquired by an inspection system. One embodiment of such a system is shown in FIG. 5. The system includes inspection system 42 configured to acquire output for a wafer using an inspection recipe. The inspection system may be configured as described further herein. The inspection system may be configured to acquire the output for the wafer in any suitable manner. The system also includes computer system 40 configured to determine a characteristic of the output for the wafer. The computer system may be configured to determine the characteristic according to any of the embodiments described herein. Computer system 40 is also configured to compare the characteristic to a reference characteristic. The computer system may be configured to compare the characteristic to the reference characteristic according to any of the embodiments described herein. In addition, if the characteristic is above the reference characteristic, the computer system is configured to alter the output acquired for the wafer such that the to characteristic of the altered output substantially matches the reference characteristic thereby stabilizing the output acquired for the wafer to the reference characteristic. The computer system may be configured to alter the output according to any of the embodiments described herein. Computer system 40 may be configured to perform any other step(s) of any of the method embodiments) described herein.

Computer system 40 may be coupled to the inspection system in any manner known in the art. For example, computer system 40 may be coupled to a computer system (not shown) of inspection system 42 such that the computer system can receive output acquired for the wafer from the computer system of the inspection system. Alternatively, computer system 40 may form part of the inspection system. For example, computer system 40 may be included in the inspection system.

The embodiments described herein may be implemented by modifying an existing computer system or an existing inspection system such that the existing computer system or existing inspection system can perform one or more embodiments described herein. In particular, the embodiments described herein may be implemented as an add-on application for a computer system or an inspection system. The application may be executed by the program instructions as described above (e.g., by software that is configured to execute one or more algorithms to perform one or more steps of the embodiments described herein).

The embodiments of the system shown in FIG. 5 may be further configured as described herein. In addition, the system may be configured to perform any other step(s) of any of the method embodiment(s) described herein.

Further modifications and alternative embodiments of various aspects of the invention may be apparent to those skilled in the art in view of this description. For example, computer-implemented methods, carrier media, and systems for stabilizing output acquired by an inspection system are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for stabilizing output acquired by an inspection system, comprising:
   determining a characteristic of output acquired for a wafer by an inspection system using an inspection recipe, wherein the output comprises intensity data, and wherein the characteristic is a bandwidth of a histogram of the intensity data acquired across a portion of the wafer;
   comparing the characteristic to a reference characteristic; and
   if the characteristic is above the reference characteristic, altering the output acquired for the wafer such that the characteristic of the altered output substantially matches the reference characteristic thereby stabilizing the output acquired for the wafer to the reference characteristic.

2. The method of claim 1, wherein said determining comprises determining the characteristic for each job in a scan of the wafer using the output corresponding to each job.

3. The method of claim 1, wherein the reference characteristic is selected by a user.

4. The method of claim 1, wherein the reference characteristic is a characteristic of output acquired for a second wafer by an inspection system, and wherein the second wafer is used to setup the inspection recipe.

5. The method of claim 1, wherein the reference characteristic is a characteristic of output acquired for a second wafer by an inspection system, wherein the second wafer is used to setup the inspection recipe, and wherein said comparing comprises comparing the characteristic determined for a job in a scan of the wafer to the reference characteristic determined for a corresponding job in a scan of the second wafer.

6. The method of claim 1, wherein the reference characteristic is a characteristic of output acquired for a second wafer by an inspection system, wherein the second wafer is used to setup the inspection recipe, wherein said comparing comprises comparing the characteristic determined for a job in a scan of the wafer to the reference characteristic determined for a corresponding job in a scan of the second wafer and comparing the characteristic to a different reference characteristic selected by a user, and wherein if the characteristic is above the reference characteristic or the different reference characteristic, said altering comprises altering the output acquired for the wafer such that the characteristic of the altered output substantially matches the reference characteristic or the different reference characteristic, respectively.

7. The method of claim 1, wherein said determining comprises determining the characteristic for a job in a scan of the wafer using the output corresponding to the job, and wherein the reference characteristic is selected from the lowest of a reference characteristic determined for a corresponding job in a scan of a second wafer performed by an inspection system, wherein the second wafer is used to setup the inspection recipe, or a different reference characteristic selected by a user.

8. The method of claim 1, wherein said altering further stabilizes the output acquired for the wafer by reducing variations in noise in the output as a function of position across the wafer.

9. The method of claim 1, wherein said altering comprises a linear mapping of the intensity data corresponding to a job in a scan of the wafer to the reference characteristic.

10. The method of claim 1, wherein said determining, said comparing, and said altering are performed on a job-to-job basis as the output is acquired for the wafer.

11. The method of claim 1, wherein said determining, said comparing, and said altering are performed prior to using the output to detect defects on the wafer, wherein if the altering step is not performed, the method further comprises using the output to detect the defects on the wafer, and wherein if the altering step is performed, the method further comprises using the altered output to detect the defects on the wafer.

12. The method of claim 1, wherein the reference characteristic is a characteristic of output acquired for a second wafer by an inspection system, wherein the second wafer is used to setup the inspection recipe, and wherein the inspection system that acquired the output for the wafer is the inspection system that acquired the output for the second wafer.

13. The method of claim 1, wherein the reference characteristic is a characteristic of output acquired for a second wafer by an inspection system, wherein the second wafer is used to setup the inspection recipe, wherein the inspection system that acquired the output for the wafer is a different inspection system than the inspection system that acquired the output for the second wafer, and wherein said altering further stabilizes the output acquired for the wafer by the inspection system to the different inspection system.

14. The method of claim 1, wherein stabilizing the output acquired for the wafer to the reference characteristic comprises reducing noise in the output acquired for the wafer due to process variations on the wafer.

15. The method of claim 1, wherein the output for the wafer further comprises output acquired in a dark field mode of the inspection system.

16. A carrier medium, comprising program instructions executable on a computer system for performing a computer-implemented method for stabilizing output acquired by an inspection system, wherein the carrier medium is a non-transitory storage medium, and wherein the computer-implemented method comprises:

determining a characteristic of output acquired for a wafer by an inspection system using an inspection recipe, wherein the output comprises intensity data, and wherein the characteristic is a bandwidth of a histogram of the intensity data acquired across a portion of the wafer;

comparing the characteristic to a reference characteristic; and if the characteristic is above the reference characteristic, altering the output acquired for the wafer such that the characteristic of the altered output substantially matches the reference characteristic thereby stabilizing the output acquired for the wafer to the reference characteristic.

17. A system configured to stabilize output acquired by an inspection system, comprising:

an inspection system configured to acquire output for a wafer using an inspection recipe; and a computer system configured to:

determine a characteristic of the output for the wafer, wherein the output comprises intensity data, and wherein the characteristic is a bandwidth of a histogram of the intensity data acquired across a portion of the wafer;

compare the characteristic to a reference characteristic; and if the characteristic is above the reference characteristic, alter the output acquired for the wafer such that the characteristic of the altered output substantially matches the reference characteristic thereby stabilizing the output acquired for the wafer to the reference characteristic.

* * * * *